United States Patent [19]
Joo et al.

[11] Patent Number: 5,843,818
[45] Date of Patent: Dec. 1, 1998

[54] METHODS OF FABRICATING FERROELECTRIC CAPACITORS

[75] Inventors: Suk-ho Joo, Seoul; Jong Moon, Kyungki-do, both of Rep. of Korea

[73] Assignee: Samsung Electronics Co., Ltd., Kyungki-do, Rep. of Korea

[21] Appl. No.: 760,576

[22] Filed: Dec. 3, 1996

[30] Foreign Application Priority Data

Dec. 5, 1995 [KR] Rep. of Korea ................. 1995 46910

[51] Int. Cl.⁶ .................... H01L 21/20; H01L 21/8242
[52] U.S. Cl. .................. 438/240; 438/3; 438/254; 438/397
[58] Field of Search .................. 438/240, 253, 438/254, 396, 397, 3; 257/310

[56] References Cited

U.S. PATENT DOCUMENTS

| | | | |
|---|---|---|---|
| 5,046,043 | 9/1991 | Miller et al. | 365/145 |
| 5,099,305 | 3/1992 | Takenaka | 357/51 |
| 5,270,241 | 12/1993 | Dennison et al. | 438/396 |
| 5,346,844 | 9/1994 | Cho et al. | 438/253 |
| 5,392,189 | 2/1995 | Fazan et al. | 257/306 |
| 5,488,011 | 1/1996 | Figura et al. | 438/253 |
| 5,489,548 | 2/1996 | Nishioka et al. | 438/396 |
| 5,506,166 | 4/1996 | Sandhu et al. | 438/396 |
| 5,668,038 | 9/1997 | Huang et al. | 438/396 |

OTHER PUBLICATIONS

Nishikawa, Kazuyasu, et al., *Etching of patinum and high dielectric constant films, Japanese Applied Physics*, vol. 63, No. 11 (1994), pp. 1139–1142.

*Primary Examiner*—Charles L. Bowers, Jr.
*Assistant Examiner*—Toniae M. Thomas
*Attorney, Agent, or Firm*—Myers Bigel Sibley & Sajovec

[57] ABSTRACT

Methods of producing ferroelectric capacitors where the electrodes are formed in a contact hole. These methods include the steps of forming an insulating layer on an integrated circuit substrate. A contact hole is then formed through the insulating layer layer to expose a region of the integrated circuit substrate and to define a storage node pattern. A layer of oxidation-resistant conductive material is formed in the contact hole and the insulating layer removed to define a first storage electrode by exposing the layer of oxidation-resistant conductive material. A ferroelectric layer is then formed on the first storage electrode and a second storage electrode is formed on the ferroelectric layer opposite the first storage electrode.

29 Claims, 8 Drawing Sheets

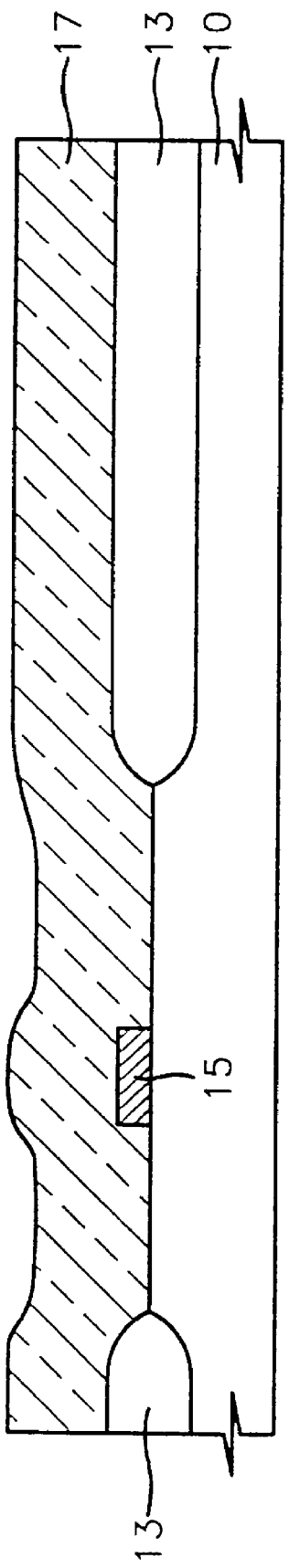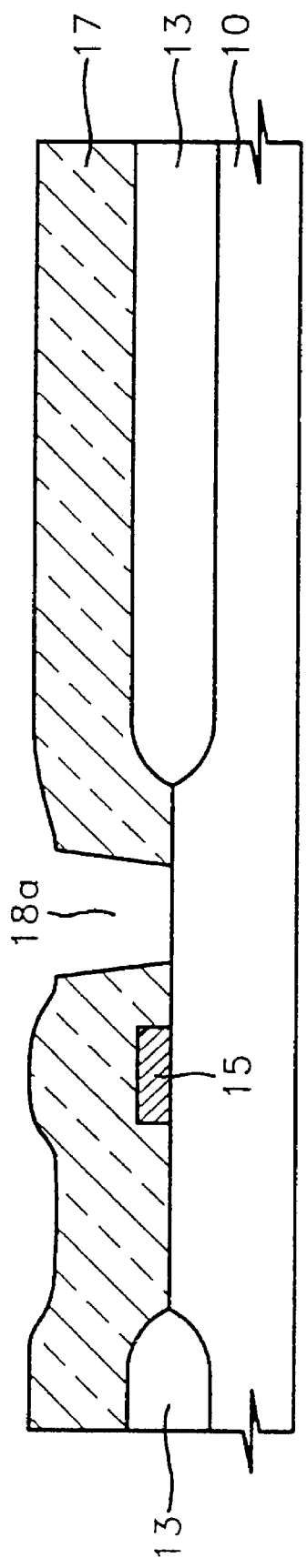

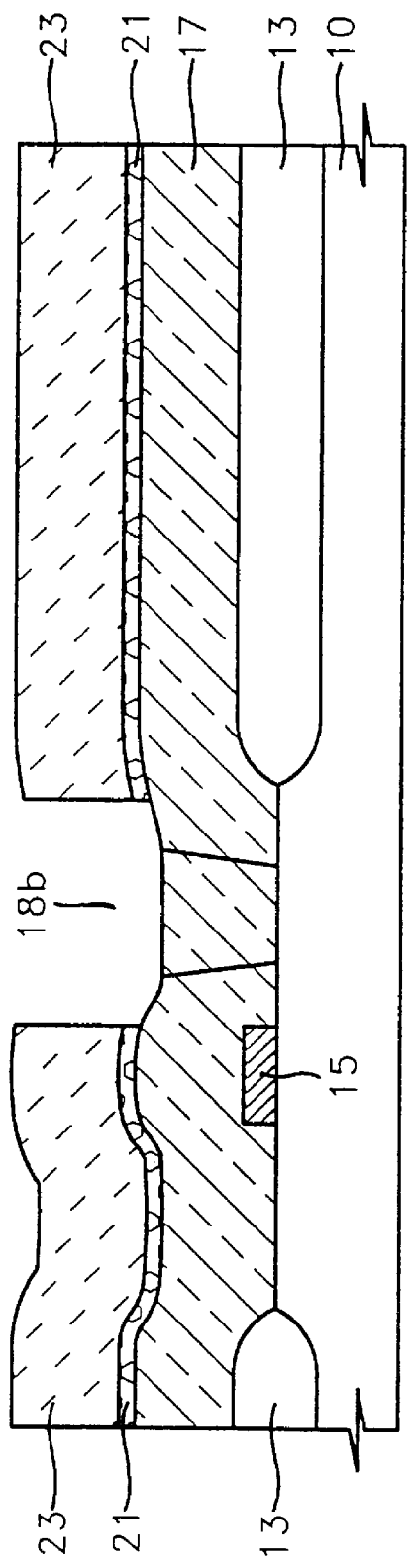
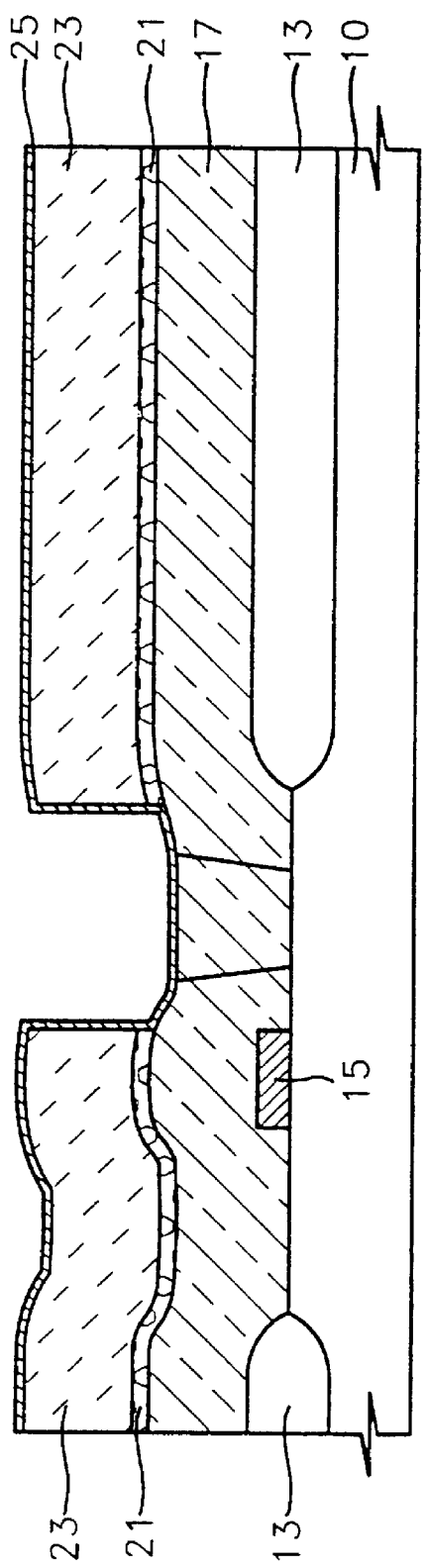

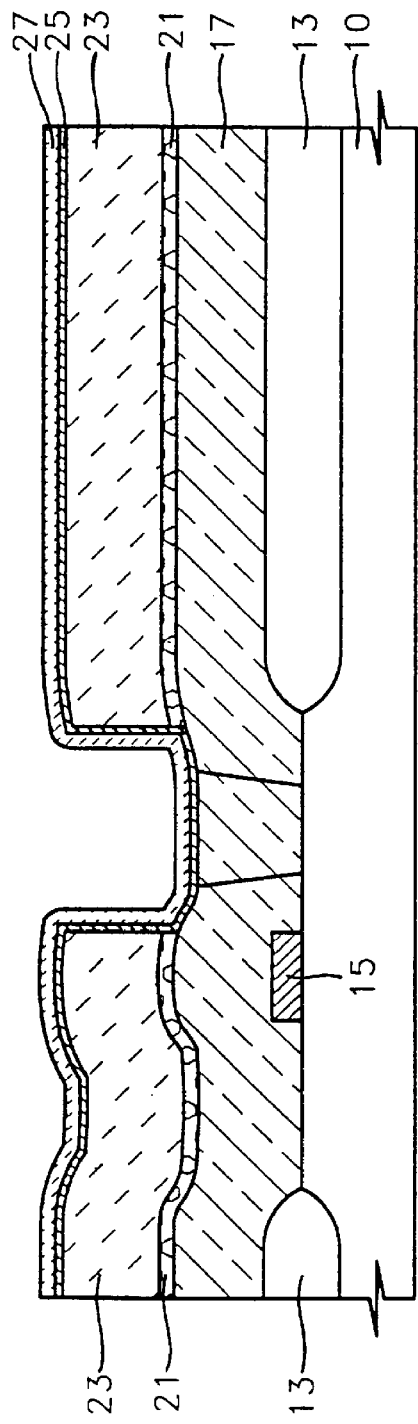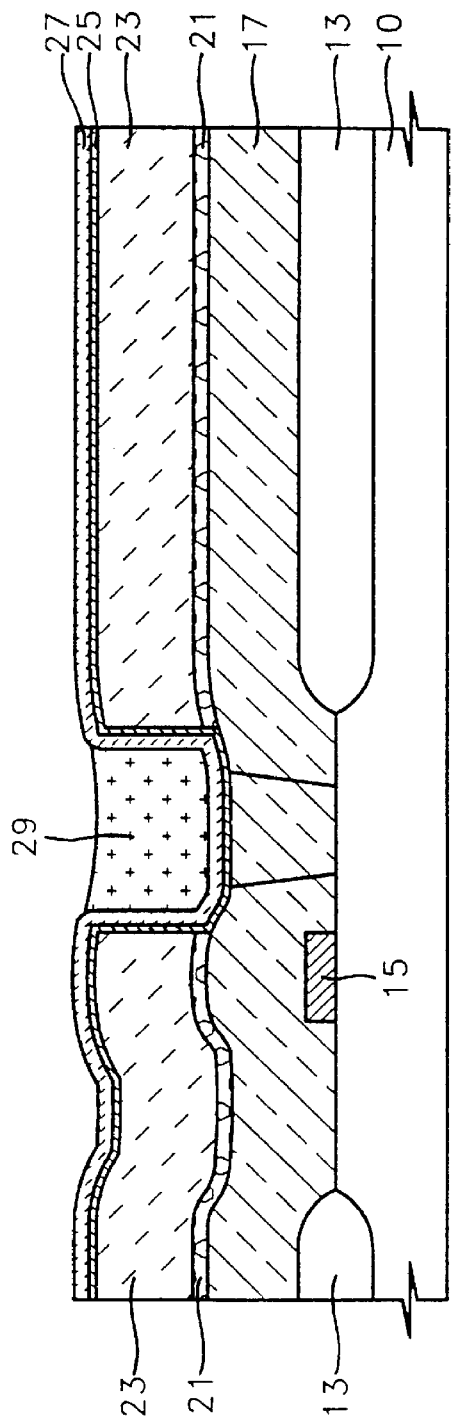

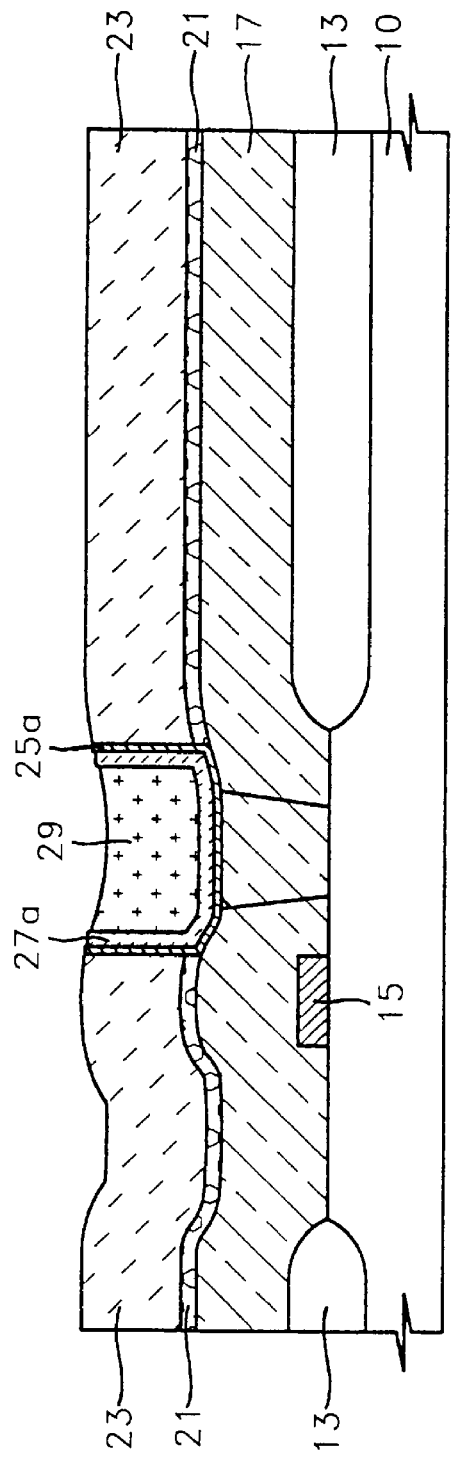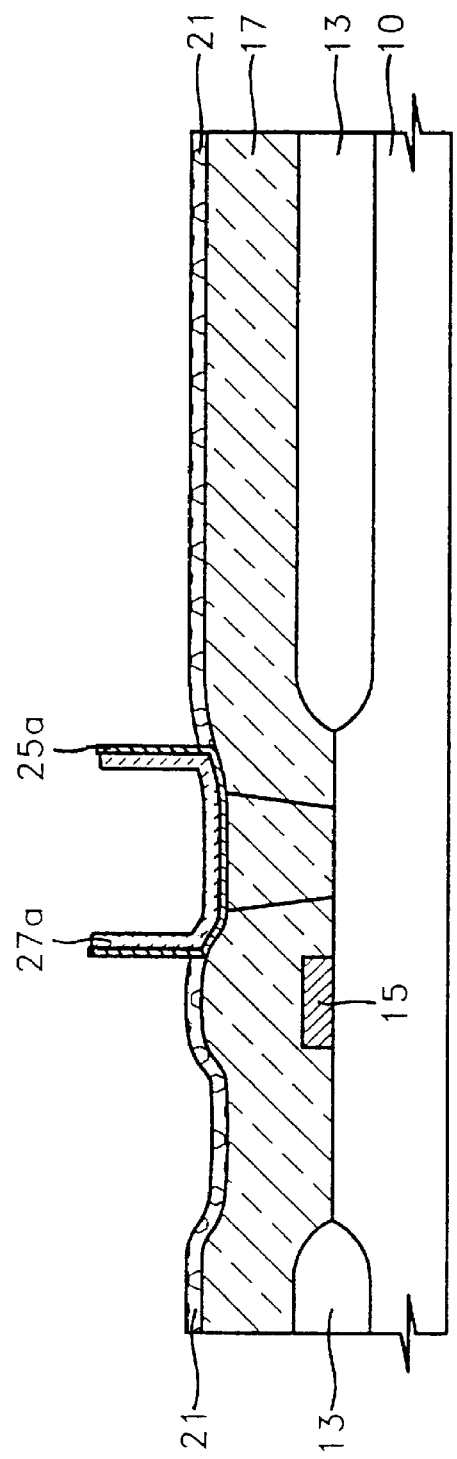

METHODS OF FABRICATING FERROELECTRIC CAPACITORS

FIELD OF THE INVENTION

The present invention relates to very large scale integrated (VLSI) semiconductor devices and methods of fabricating such devices. More particularly, the present invention relates to capacitors and methods of fabricating capacitors for VLSI devices.

BACKGROUND OF THE INVENTION

As integrated circuit devices, such as dynamic random access memory (DRAM), become more highly integrated the size of particular devices such as transistors and capacitors generally becomes smaller. Thus, as devices have become more integrated, typically, the effective area of capacitors has become smaller. With reduced area available for forming a capacitor it may become more difficult to achieve a desired capacitance using conventional dielectric films such as a nitride/oxide (NO) film or $Ta_2O_5$ film.

In order to increase the capacitance per unit area of a capacitor cell, three approaches have generally been attempted. These approaches include (1) reducing the thickness of the dielectric layer; (2) using a three-dimensional capacitor structure to increase the effective area of the capacitor; and (3) using a material of a high dielectric constant.

The first of these approaches may not be effective in highly integrated devices such as high capacity memory devices because a dielectric layer of 100 Ångstroms or thinner may lead to lower reliability from Fowler-Nordheim current.

Efforts to increase the effective area of a capacitor have also employed three-dimensional storage electrodes such as cylindrical or fin type storage electrodes. However, the cylindrical or fin type capacitor typically has a complicated structure which is produced by a complicated and difficult fabrication process. As a result of the complicated fabrication process, the cylindrical or fin type storage electrodes may be uneconomical to produce. Furthermore, the difficulty in the fabrication process may reduce reliability of the cylindrical or fin type storage electrode capacitors over more conventional capacitors.

To solve the problems caused by reduced capacitor area, research was begun into high dielectric films. This research included materials having a perovskite structure, e.g., $PbZrTiO_3$ (PZT), and $BaSrTiO_3$ (BST). The dielectric constant of these ferroelectric materials are 100 times or more higher than that of a silicon oxide or NO film. Therefore, it is possible to achieve a desired capacitance with less area and without the need for a complicated cylindrical or fin-type electrode.

In utilizing a ferroelectric material as a capacitor dielectric layer, an oxidation-resistant conductive material, preferably a noble metal, such as platinum should be used as an electrode material. Platinum may be used as an electrode material because platinum does not oxidize in a high temperature oxygen ambient environment. Furthermore, a thin layer of a perovskite structure material having excellent characteristics may be formed on platinum.

Conventional technology used to produce capacitors in highly integrated and miniaturized DRAMs through the use of a high dielectric constant layer and a platinum electrode is described in U.S. Pat. No. 5,099,305 entitled *Platinum Capacitor MOS Memory Latticed Matched PZT* and in U.S. Pat. No. 5,046,043 entitled *Ferroelectric Capacitor and Memory Cell Including Barrier and Isolation Layers.*

As is well known, however, platinum may be very difficult to pattern into the form of a storage node because it is a chemically stable material. While studies have been conducted on patterning platinum using a halogen gas plasma, such as F, $Cl_2$, and Br, platinum seldom reacts with such halogen gases. Even if a reaction occurs, the vapor pressure of the resulting compound may be too low to be removed. Additionally, while studies on platinum etching using a mixture of Ar and $Cl_2$ gases has been described by Nishikawa et al. in Applied Physics, Vol. 63, No. 11, 1994, pp. 1139–1142, the problems of sidewall deposition of by products on the masks and of low etching rate may remain.

FIG. 1 illustrates how deposition of a sidewall attached layer on the mask for patterning a platinum layer may result from etching the platinum layer. As seen in FIG. 1, formation of a layer 200 attached to the sidewall of the mask photoresist PR may occur during the etching of the platinum layer 100. The creation of this undesired sidewall deposition may be attributed to (1) direct attachment of a platinum reaction product; (2) attachment of the platinum reaction product by way of a gas layer 300; (3) direct attachment of a resist reaction product; (4) deposition of the resist reaction product by way of a gas layer; and (5) attachment caused by the etching gas. Thus, the sidewall layer may be created both by direct attachment of a reaction product produced near the resist pattern PR and re-attachment of the reaction product released to the gas plasma layer 300.

As is seen in FIG. 2 this sidewall layer 200 remains after etching the resist pattern PR. These undesired sidewalls may cause device failures. Accordingly, improvements in methods of forming and patterning platinum electrodes are needed.

SUMMARY OF THE INVENTION

In view of the above discussion, it is an object of the present invention to provide methods of forming patterned electrodes of oxidation-resistant conductive materials without the creation of undesired sidewalls.

A further object of the present invention is to provide method of fabricating high reliability ferroelectric capacitors using platinum or other oxidation-resistant conductive materials as electrodes.

These and other objects of the present invention are provided by methods of producing ferroelectric capacitors where the electrodes are formed in a contact hole. These methods include the steps of forming an insulating layer on an integrated circuit substrate. A contact hole is then formed through the insulating layer layer to expose a region of the integrated circuit substrate and to define a storage node pattern. A layer of an oxidation-resistant conductive material is formed in the contact hole and the insulating layer is removed to define a first storage electrode and to expose the layer of an oxidation-resistant conductive material. A ferroelectric layer is then formed on the first storage electrode and a second storage electrode is formed on the ferroelectric layer opposite the first storage electrode.

The oxidation-resistant conductive material may be an oxidation-resistant noble metal such as platinum.

By forming the electrode for the ferroelectric capacitor in a contact hole, the electrode may be patterned without the formation of unwanted sidewall artifacts such as described above. Through the use of the contact hole, the three-dimensional electrode may be formed without redeposition of compounds or redeposition of the conductive material because the topography of the structure on which the conductive layer is formed establishes the shape of the electrodes rather than a photoresist mask. In other words, there are no sidewall surfaces exposed on which unwanted formation may occur. Thus, the present invention may provide for a patterned electrode of an oxidation-resistant conductive material such as platinum without the undesired reformation of conventional patterning and etching procedures. Because the formation of electrode patterns may be more precisely controlled, the present invention may provide higher relaibility capacitors then may be provided by conventional methods.

Further embodiments of the present invention include forming a nitride layer on an integrated circuit substrate. In such an embodiment the insulating layer is formed on the nitride layer opposite the integrated circuit substrate and the contact hole is formed through the insulating layer and through the nitride layer. The nitride layer may act as a stop layer for removing the insulating layer.

In another embodiment an insulating mask is formed on the layer of oxidation-resistant conductive material formed in the contact hole. Then, the insulating layer and the insulating mask are removed to define a first storage electrode by exposing the layer of oxidation-resistant conductive material. The insulating layer and the insulating mask may be formed of oxide and may be simultaneously removed by wet etching. In particular, the insulating layer may be formed of a material selected from the group consisting of borophosphorous silicate glass, undoped silicate glass, silicon oxide formed by plasma enhanced chemical vapor deposition (PECVD) using $SiH_4$, PE-TEOS, spin glass, high temperature oxide and field oxide.

The ferroelectric layer may be formed of a material selected from the group consisting of $PbZrTiO_3$ and $BaSrTiO_3$. Also, the ferroelectric layer may be formed by metal organic chemical vapor deposition.

In another embodiment of the present invention, a barrier metal layer is formed in the contact hole to prevent diffusion into the layer of oxidation-resistant conductive material. The layer of oxidation-resistant conductive material is then formed on the barrier metal layer in the contact hole opposite the integrated circuit substrate and the insulating layer. The barrier metal may be titanium nitride.

In a particular embodiment of the present invention, the contact hole is formed so as to contact a conductive plug formed through an insulating layer of the integrated circuit substrate.

BRIEF DESCRIPTION OF THE DRAWINGS

The above objects and advantages of the present invention will become more apparent by describing in detail preferred embodiments thereof with reference to the attached drawings in which:

FIGS. 3 through 13 are cross-sectional views illustrating steps for fabricating ferroelectric capacitors according to the present invention.

DETAILED DESCRIPTION OF THE PREFERRED EMBODIMENTS

Figure 1:
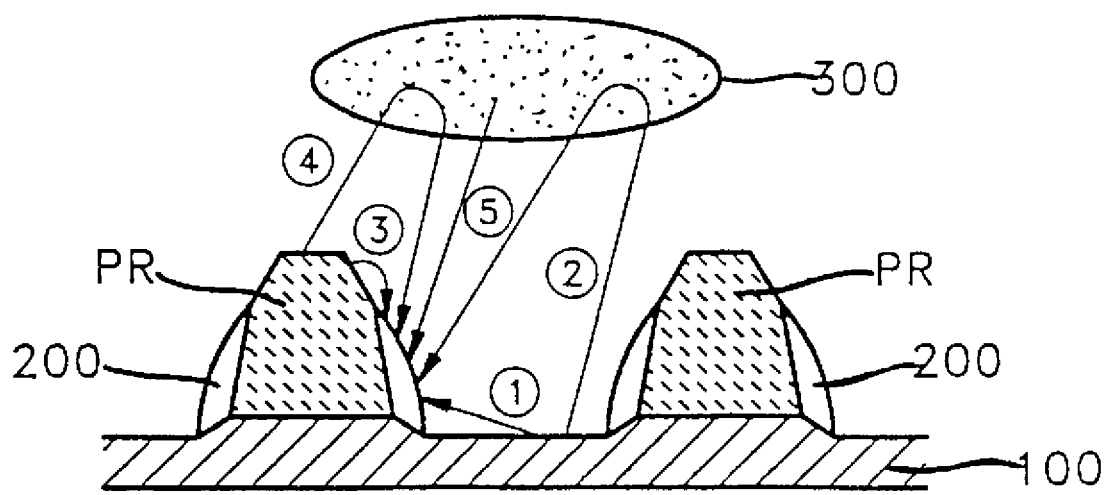
FIG. 1 is an illustration of a sidewall layer formed on a mask pattern used for patterning a platinum electrode.
Figure 2:
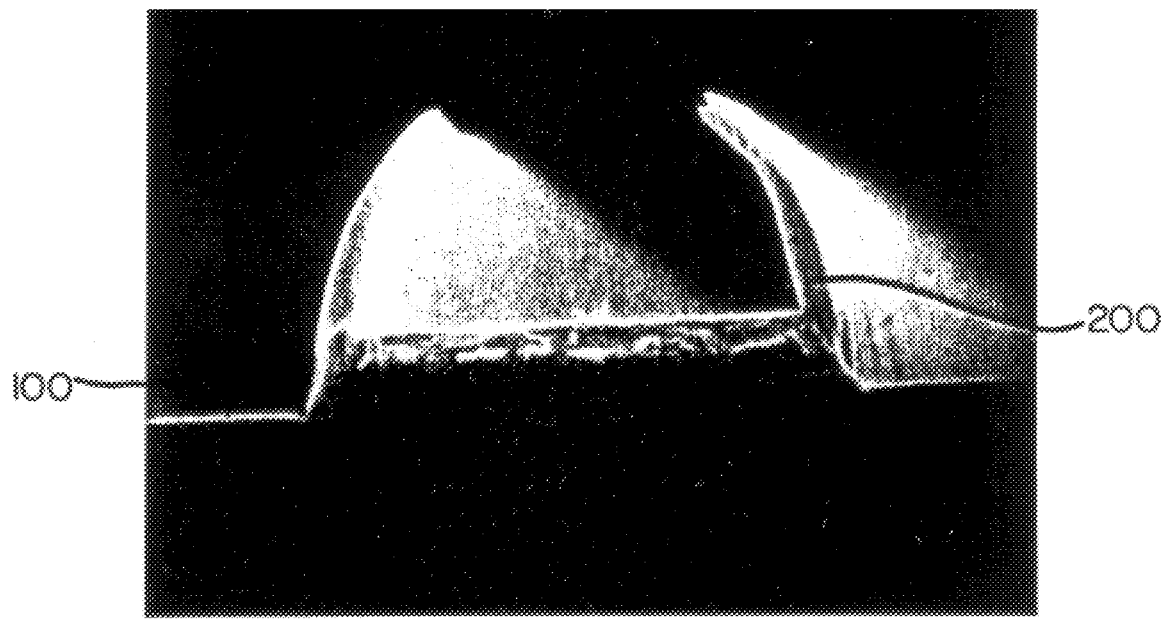
FIG. 2 is an SEM photograph of a platinum electrode after etching the electrode illustrated in FIG. 1.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Methods for fabricating ferroelectric capacitors according to the present invention will be described with reference to FIGS. 3 through 13.

As seen in FIG. 3, an insulating interlayer 17 is formed for isolation and planarization of a semiconductor substrate 10 having transistors or other semiconductor devices formed therein to create an integrated circuit substrate. After an active region of the substrate 10 is defined by a field oxide layer 13, which may be formed by a general local oxidation of silicon process (LOCOS), a gate 15 and source and drain regions (not shown) are formed in the active region of the substrate 10. Then the insulating interlayer 17 may be deposited on the substrate.

Thus, an integrated circuit substrate may be provided on which a capacitor according to the present invention may be formed. As used herein the term integrated circuit substrate refers to a semiconductor substrate, a semiconductor substrate having integrated circuits formed on the semiconductor substrate or other types of substrates having integrated circuits formed on the substrate. As will be appreciated by those of skill in the art, references to a layer formed "on" a substrate or other layer may refer to the layer formed directly on the substrate or other layer or on an intervening layer or layers formed on the substrate or other layer.

As seen in FIG. 4, a contact hole 18a may be formed through the insulating interlayer 17 to make contact with, for example, a source region (not shown) of a transistor formed in the integrated circuit substrate. The contact hole may be formed by methods known to those of skill in the art such as dry etching.

Figure 5:
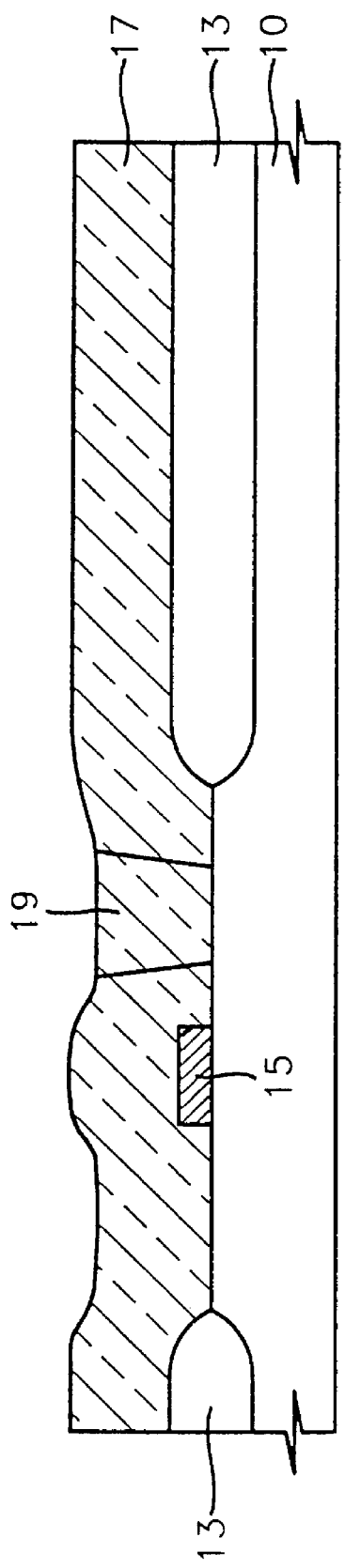

FIG. 5 illustrates the formation of a conductive plug 19, such as a polysilicon plug, in the contact hole 18a. The plug 19 may be formed by forming a polysilicon layer to a thickness sufficient to bury the contact hole 18a and then etching back the polysilicon layer or using chemical mechanical polishing to remove the excess polysilicon and leave a plug 19. The plug 19 may also be formed of tungsten using a similar procedure.

Figure 6:
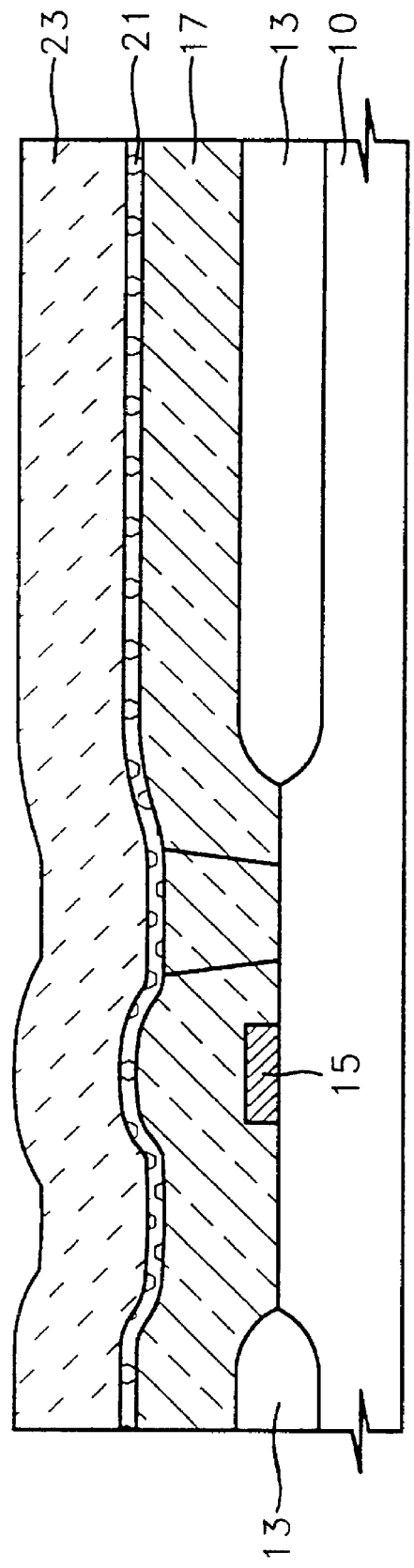

FIG. 6 illustrates the formation of a silicon nitride (SiN) layer 21 on the insulating interlayer 17.

The nitride layer 21 may be used as a stop layer in a subsequent etching process. An insulating layer 23 is also formed on the nitride layer 21 opposite the insulating interlayer 17. The insulating layer 23 may be formed of borophosphorous silicate glass (BPSG), undoped silicate glass (USG), silicon oxide formed by PECVD using $SiH_4$, PE-TEOS, spin on glass (SOG), high temperature oxide (HTO) and field oxide.

FIG. 7 illustrates the formation of a contact hole 18b formed through the insulating layer 23 and through the nitride layer 21. As seen in FIG. 7, the contact hole 18b may be formed to contact the plug 19. The contact hole 18b may be formed by dry etching the insulating layer 23 and the nitride layer 21 using a predetermined mask pattern. The size of the contact hole 18b is determined by the geometry of the storage electrode to be subsequently formed.

FIG. 8 shows the formation of a barrier metal layer 25 on the contact hole 18b and the exposed surfaces of the insulating layer 23. The barrier metal layer 25 is formed to prevent migration of silicon in the plug 19 into an oxidation-resistant conductive material layer formed in the contact hole. For example, silicidation occurs at the contact between platinum and polysilicon. Thus, silicidation could occur where a platinum layer contacts the polysilicon plug 19 of the substrate 10. Silicidation at the contact point may cause silicon to diffuse into the platinum which may affect a dielectric layer formed on the platinum. Therefore, a barrier metal layer is formed to suppress silicidation of an electrode material. A metal nitride such as titanium nitride (TiN) may be used as a barrier metal.

After formation of the barrier layer 25 a conformal layer of oxidation-resistant conductive material 27 is formed on the barrier layer 25. The formation of this layer is seen in FIG. 9. The oxidation-resistant conductive material layer 27 may be formed of an oxidation-resistant noble metal such as platinum.

As seen in FIG. 10, an insulating mask 29 is formed on the oxidation-resistant conductive material 27 in the contact hole 18b. To form the insulating mask 29 an insulating layer, such as an oxide layer, may be deposited on the overall surface of the oxidation-resistant conductive material 27. This layer is then etched back using the contact hole 18b as a stop to leave only the insulating material 29 in the contact hole 18b.

FIG. 11 illustrates the removal of the oxidation-resistant conductive material layer 27 and the barrier layer 25 from regions outside the contact hole 18b. The oxidation-resistant conductive material 27 and the barrier layer 25 are removed to leave the electrode patterned region of oxidation-resistant conductive material 27a and region of barrier layer 25a. The oxidation-resistant conductive material 27 and the barrier layer 25 may be anisotropically etched using the insulating mask 29. In the etching step, adhesion of reaction products to the sidewalls of a mask pattern can be prevented since the mask 29 buried in the contact hole 18b has no exposed sidewalls.

As seen in FIG. 12, the three dimensional lower electrode pattern 27a may be removed from the insulating layer 23 and the mask 29 by removing the insulating layer 23 using the nitride layer 21 as a stop layer. The insulating layer 23 and the mask 29 may be simultaneously removed by a wet-etching process. By using the nitride layer 21 as a stop layer the need for an additional mask may be avoided.

Figure 13:
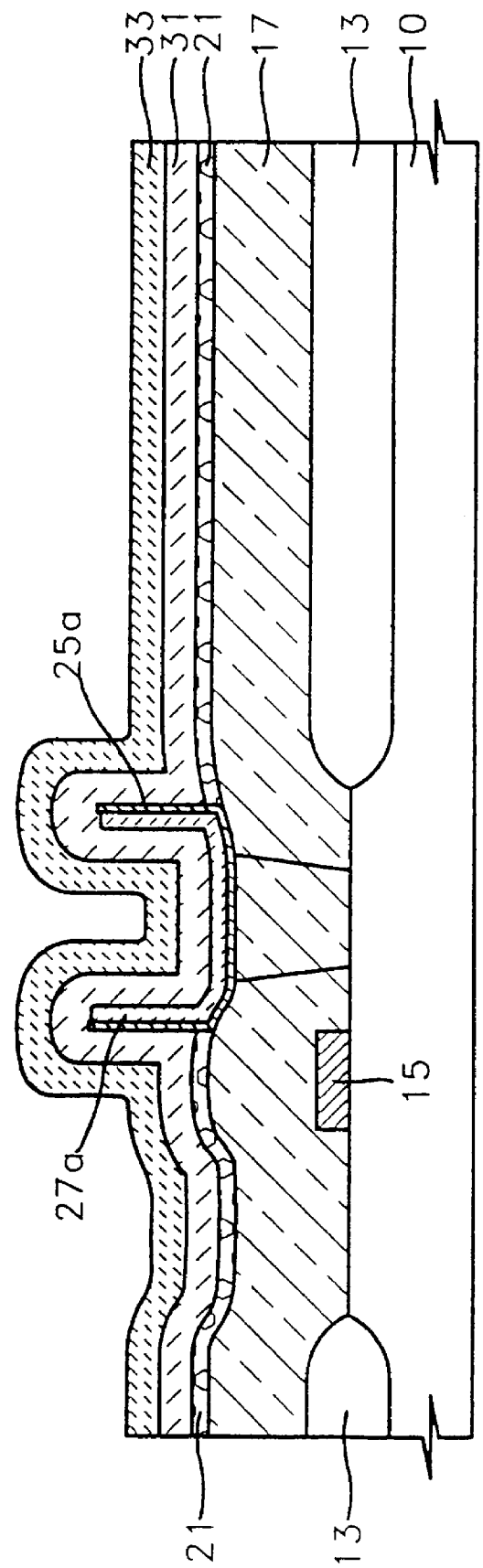

FIG. 13 illustrates completion of the ferroelectric capacitor by formation of a ferroelectric layer 31 on the first electrode made up of regions 25a and 27a. A second electrode 33 is then formed on the ferroelectric layer 31 to complete the capacitor.

The ferroelectric layer is formed by depositing a dielectric material having a high dielectric constant such as BST or STO. The deposition process may be performed by metal organic chemical vapor deposition (MOCVD) generally at a low temperature of about 450 degrees centigrade in an oxygen ambient atmosphere. Then a heat treatment is performed at a high temperature which, in some cases, may beneficially increase the dielectric constant of the material. The second electrode 33 may also be formed of an oxidation-resistant conductive material such as an oxidation-resistant noble metal like platinum.

In the drawings and specification, there have been disclosed typical preferred embodiments of the invention and, although specific terms are employed, these terms are used in a generic and descriptive sense only and not for purposes of limitation, the scope of the invention being set forth in the following claims.

That which is claimed is:

1. A method of fabricating a ferroelectric capacitor, the method comprising the steps of:

forming a nitride layer on an integrated circuit substrate;

forming an insulating layer on the nitride layer opposite the integrated circuit substrate, the insulating layer including a contact hole through the insulating layer and the nitride layer which exposes a region of the integrated circuit substrate and which defines a storage node pattern;

forming a layer of oxidation-resistant conductive material in the contact hole;

removing the insulating layer to define a first storage electrode by exposing the layer of oxidation-resistant conductive material;

forming a ferroelectric layer on the first storage electrode; and forming a second storage electrode on the ferroelectric layer opposite the first storage electrode.

2. A method of fabricating a ferroelectric capacitor according to claim 1, wherein the nitride layer acts as a stop layer for said removing step.

3. A method of fabricating a ferroelectric capacitor according to claim 1, wherein said removing step is preceded by the step of forming an insulating mask on the layer of oxidation-resistant conductive material in the contact hole and wherein said removing step comprises removing the insulating layer and the insulating mask to define a first storage electrode by exposing the layer of oxidation-resistant conductive material.

4. A method of fabricating a ferroelectric capacitor according to claim 3, wherein the insulating layer comprises an oxide layer and wherein the insulating mask is formed of an oxide.

5. A method of fabricating a ferroelectric capacitor according to claim 3, wherein said removing step comprises simultaneously removing the insulating layer and the insulating mask by wet etching.

6. A method of fabricating a ferroelectric capacitor according to claim 1, wherein the insulating layer is formed of a material selected from the group consisting of boro-phosphorous silicate glass, undoped silicate glass, silicon oxide formed by PECVD using $SiH_4$, PE-TEOS, spin on glass, high temperature oxide and flowable oxide.

7. A method of fabricating a ferroelectric capacitor according to claim 1, wherein the ferroelectric layer is formed of a material selected from the group consisting of $PbZrTiO_3$ and $BaSrTiO_3$.

8. A method of fabricating a ferroelectric capacitor according to claim 7, wherein the ferroelectric layer is formed by metal organic chemical vapor deposition.

9. A method of fabricating a ferroelectric capacitor according to claim 1, wherein said step of forming a layer of oxidation-resistant conductive material is preceded by the step of:

forming a barrier metal layer in the contact hole to prevent diffusion into a layer of oxidation-resistant conductive material; and wherein said step of forming a layer of oxidation-resistant conductive material comprises the step of forming a layer of oxidation-resistant conductive material on the barrier metal layer in the contact hole opposite the integrated circuit substrate and the insulating layer.

10. A method of fabricating a ferroelectric capacitor according to claim 9, wherein the barrier metal is titanium nitride.

11. A method of fabricating a ferroelectric capacitor according to claim 1, wherein the contact hole is formed so as to contact a conductive plug formed through an insulating layer on the integrated circuit substrate.

12. A method of fabricating a ferroelectric capacitor according to claim 1, wherein said oxidation-resistant conductive material comprises oxidation-resistant noble metal.

13. A method of fabricating a ferroelectric capacitor according to claim 1, wherein the oxidation-resistant conductive material comprises platinum.

14. A method of fabricating a ferroelectric capacitor, the method comprising the steps of:

forming a nitride layer on an integrated circuit substrate;

forming an insulating layer on the nitride layer opposite the integrated circuit substrate, the insulating layer including a contact hole through the insulating layer and the nitride layer which exposes a region of the integrated circuit substrate and which defines a storage node pattern;

forming a layer of oxidation-resistant conductive material in the contact hole and on the insulating layer opposite the integrated circuit substrate;

removing the layer of oxidation-resistant conductive material from the insulating layer opposite the integrated circuit substrate, while allowing the layer of oxidation-resistant conductive material to remain in the contact hole to define a first storage electrode;

forming a ferroelectric layer on the first storage electrode; and forming a second storage electrode on the ferroelectric layer opposite the first storage electrode.

15. A method of fabricating a ferroelectric capacitor according to claim 14, wherein the ferroelectric layer is formed of a material selected from the group consisting of $PbZrTiO_3$ and $BaSrTiO_3$.

16. A method of fabricating a ferroelectric capacitor according to claim 14, wherein said step of forming a layer of oxidation-resistant conductive material is preceded by the step of:

forming a barrier metal layer in the contact hole to prevent diffusion into a layer of oxidation-resistant conductive material; and wherein said step of forming a layer of oxidation-resistant conductive material comprises the step of forming a layer of oxidation-resistant conductive material on the barrier metal layer in the contact hole opposite the integrated circuit substrate and the insulating layer.

17. A method of fabricating a ferroelectric capacitor according to claim 14, wherein said oxidation-resistant conductive material comprises oxidation-resistant noble metal.

18. A method of fabricating a ferroelectric capacitor according to claim 14, wherein the oxidation-resistant conductive material comprises platinum.

19. A method of fabricating a ferroelectric capacitor, the method comprising the steps of:

forming an insulating layer on an integrated circuit substrate, the insulating layer including a contact hole which exposes a region of the integrated circuit substrate and which defines a storage node pattern;

forming a layer of oxidation-resistant conductive material in the contact hole;

forming an insulating mask on the layer of oxidation-resistant conductive material in the contact hole;

removing the insulating layer and the insulating mask to define a first storage electrode by exposing the layer of oxidation-resistant conductive material;

forming a ferroelectric layer on the first storage electrode; and forming a second storage electrode on the ferroelectric layer opposite the first storage electrode.

20. A method of fabricating a ferroelectric capacitor according to claim 19, wherein the insulating layer comprises an oxide layer and wherein the insulating mask is formed of an oxide.

21. A method of fabricating a ferroelectric capacitor according to claim 19, wherein said removing step comprises simultaneously removing the insulating layer and the insulating mask by wet etching.

22. A method of fabricating a ferroelectric capacitor according to claim 19, wherein the insulating layer is formed of a material selected from the group consisting of borophosphorous silicate glass, undoped silicate glass, silicon oxide formed by plasma enhanced chemical vapor deposition (PECVD) using $SiH_4$, PE-TEOS, spin on glass, high temperature oxide and flowable oxide.

23. A method of fabricating a ferroelectric capacitor according to claim 19, wherein the ferroelectric layer is formed of a material selected from the group consisting of $PbZrTiO_3$ and $BaSrTiO_3$.

24. A method of fabricating a ferroelectric capacitor according to claim 23 wherein the ferroelectric layer is formed by metal organic chemical vapor deposition.

25. A method of fabricating a ferroelectric capacitor according to claim 19, wherein said step of forming a layer of oxidation-resistant conductive material is preceded by the step of:

forming a barrier metal layer in the contact hole to prevent diffusion into a layer of oxidation-resistant conductive material; and wherein said step of forming a layer of oxidation-resistant conductive material comprises the step of forming a layer of oxidation-resistant conductive material on the barrier metal layer in the contact hole opposite the integrated circuit substrate and the insulating layer.

26. A method of fabricating a ferroelectric capacitor according to claim 25, wherein the barrier metal is titanium nitride.

27. A method of fabricating a ferroelectric capacitor according to claim 19, wherein the contact hole is formed so as to contact a conductive plug formed through an insulating layer on the integrated circuit substrate.

28. A method of fabricating a ferroelectric capacitor according to claim 19, wherein said oxidation-resistant conductive material comprises oxidation-resistant noble metal.

29. A method of fabricating a ferroelectric capacitor according to claim 19, wherein the oxidation-resistant conductive material comprises platinum.

* * * * *